United States Patent [19]

Miyokawa

[11] Patent Number: 4,926,055

[45] Date of Patent: May 15, 1990

[54] FIELD EMISSION ELECTRON GUN

[75] Inventor: Toshiaki Miyokawa, Tokyo, Japan

[73] Assignee: Jeol Ltd., Tokyo, Japan

[21] Appl. No.: 299,341

[22] Filed: Jan. 23, 1989

[30] Foreign Application Priority Data

Jan. 25, 1988 [JP] Japan .................. 63-15288

[51] Int. Cl.$^5$ ......................................... H01J 37/073
[52] U.S. Cl. .............................. 250/423 R; 250/307;
250/309; 250/310; 250/311; 250/423 F;
250/398; 313/363.1; 313/336
[58] Field of Search ............... 250/423 R, 436, 398,
250/423 F, 310, 311, 307, 309; 378/122, 124,
137, 145, 146, 113, 141; 313/361.1, 413, 414,
363.1, 308, 359.1, 336, 449, 460.1

[56] References Cited

U.S. PATENT DOCUMENTS

| | | | |
|---|---|---|---|
| 3,784,815 | 1/1974 | Coates et al. | 250/310 |
| 3,863,095 | 1/1975 | Tonomura et al. | 313/449 |
| 3,927,321 | 12/1975 | Welter | 250/396 |
| 4,020,387 | 4/1977 | Coates et al. | 250/311 |
| 4,158,142 | 6/1979 | Haimson | 378/113 |
| 4,274,035 | 6/1981 | Fukuhara et al. | 250/398 |
| 4,315,152 | 2/1982 | Smith | 250/398 |
| 4,427,886 | 1/1984 | Martin et al. | 313/336 |
| 4,477,921 | 10/1984 | Armini et al. | 378/141 |
| 4,521,903 | 6/1985 | Braun | 378/141 |
| 4,642,461 | 2/1987 | Endo et al. | 313/363.1 |
| 4,663,525 | 5/1987 | Ohtsuki et al. | 250/307 |

*Primary Examiner*—Janice A. Howell
*Assistant Examiner*—Kiet T. Nguyen
*Attorney, Agent, or Firm*—Fitzpatrick, Cella, Harper & Scinto

[57] ABSTRACT

There is disclosed a field emission electron gun comprising a field emission tip, an extraction electrode for producing an electric field that extracts electrons from the tip, and an accelerating electrode for accelerating the electrons extracted by the extraction electrode. The extraction electrode is inclined to a plane perpendicular to the optical axis of the beam of the electrons and shaped like an inverted cone. The surface of the accelerating electrode which faces the extraction electrode is inclined in the same manner as the extraction electrode. A recess that faces the extraction electrode is formed in the center of the accelerating electrode. The ratio of the voltage $V_0$ applied to the accelerating electrode to the voltage $V_1$ applied to the extraction electrode, i.e., $V_0/V_1$, can be varied over a wide range while maintaining the virtual source within the virtual image region.

14 Claims, 7 Drawing Sheets

FIELD EMISSION ELECTRON GUN

FIELD OF THE INVENTION

The present invention relates to a field emission electron gun for use in scanning electron microscope or the like.

BACKGROUND OF THE INVENTION

FIG. 1 shows a well-known field emission electron gun. This gun comprises a cathode 1 made of tungsten or other material, an extraction electrode 2, and an accelerating electrode 3. The extraction electrode 2 produces an electric field that extracts electrons from the cathode 1. The electron beam passing through the extraction electrode 2 is accelerated by the accelerating electrode 3. A voltage of $V_1$ is applied to the extraction electrode 2 with respect to the cathode 1. A voltage $V_0$ is applied to the accelerating electrode 3 with respect to the cathode 1. The electrodes 2 and 3 together form an electrostatic lens that acts to focus the electron beam. Therefore, the electron beam passing through the accelerating electrode 3 seems as if it were emitted from a virtual electron source 4 either above or below the cathode 1. Let $S_0$ be the distance from the extraction electrode 2 to the cathode 1, and let S be the distance from the extraction electrode 2 to the virtual source 4. The distance S varies according to the ratio $V_0/V_1$ as shown in FIG. 2. When $V_0/V_1 = 1$, no lens action occurs between the extraction electrode 2 and the accelerating electrode 3. In this state, the virtual source 4 is located at the front end of the cathode 1, $S = S_0$, i.e., at the distance $S_0$ from the extraction electrode 2. As the ratio $V_0/V_1$ increases or decreases from unity, the lens action become stronger, moving the virtual source 4 upward away from the tip of the cathode. This region is called the virtual image region.

When the ratio $V_0/V_1$ reaches either a threshold value $\alpha_1$ or another threshold value $\alpha_2$, the electron beam leaving electrode 3 becomes a parallel beam. The position, or the distance S, of the virtual source 4 then changes from an infinitely remote position above the cathode 1 to an infinitely remote position below it. As the ratio $V_0/V_1$ decreases below $\alpha_1$ or increases above $\alpha_2$, the position of the virtual source 4 approaches the front end of the cathode 1 from below the accelerating electrode 3. The region less than $\alpha_1$ and the region in excess of $\alpha_2$ are known as the real image regions.

Conventional field emission electron guns use electrodes shaped and arranged as shown in FIGS. 3(a)-3(d). The threshold values $\alpha_1$ of the electron guns equipped with these electrodes range from 0.1 to 0.2, and the threshold values $\alpha_2$ are in excess of 10.

A scanning electron microscope having a field emission electron gun is required to operate from a low accelerating voltage of about 500 V to a high accelerating voltage of about 50 KV. Normally, the extraction voltage $V_1$ is changed within a range of about 4 to 8 KV. As the accelerating voltage $V_0$ is decreased, the ratio $V_0/V_1$ decreases below the threshold value $\alpha_1$. In this case, the electron gun will be operated in one real image region. In the electron gun disclosed in U.S. Pat. No. 3,784,815, the ratio $V_0/V_1$ is set less than 1, and a real image is focused by an electrostatic lens without employing other lens action. However, where the accelerating voltage is varied over a wide range, the conditions under which the virtual source is focused onto a specimen by the lens system differ entirely between the case where the virtual source in the virtual image region and the case where the virtual source is placed in one real image region. When the virtual source is shifted into a real image region from the virtual image region, it is difficult to focus the electron beam onto a specimen by the lens system disposed below the electron gun.

SUMMARY OF THE INVENTION

It is an object of the invention to provide a field emission electron gun capable of providing small values of $\alpha_1$.

It is another object of the invention to provide a field emission electron gun which permits the virtual source to be retained within the virtual image region if the ratio $V_0/V_1$ is changed over a broad range, and which enables the lens system disposed below the electron gun to be controlled easily even if the accelerating voltage is varied greatly.

The above objects are achieved in accordance with the teachings of the invention by a field emission electron gun comprising: a field emission tip; an extraction electrode for producing an electric field which extracts electrons from the tip, the extraction electrode being shaped like an inverted cone the side of which is inclined at an angle to a plane perpendicular to the optical axis of the beam of the electrons; an accelerating electrode for accelerating the electrons extracted by the extraction electrode, the surface of the accelerating electrode which faces the extraction electrode being inclined in a manner similar to the extraction electrode; and a recess being formed in the center of the accelerating electrode facing the extraction electrode.

BRIEF DESCRIPTION OF THE DRAWINGS

FIG. 15 is a graph in which the distances S to the virtual source produced by the electrode geometry shown in FIG. 14 are plotted against the ratio $V_0/V_1$;

DESCRIPTION OF THE PREFERRED EMBODIMENTS

Figure 1:
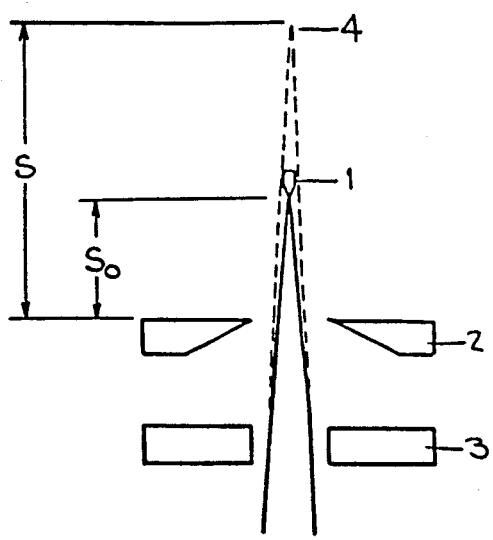
FIG. 1 is a diagram showing the geometry of a conventional field emission electron gun.
Figure 2:
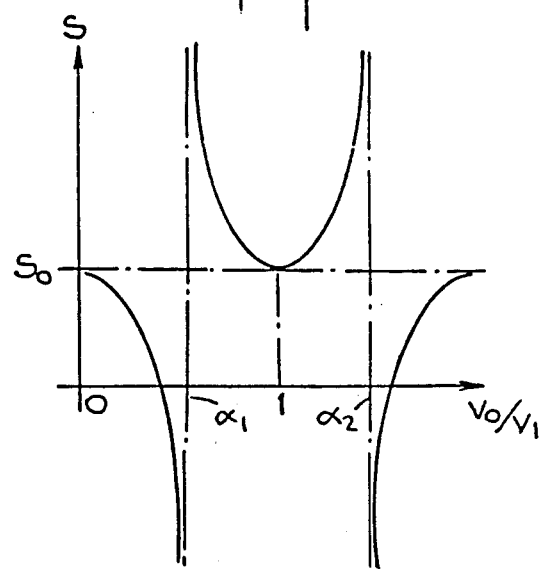
FIG. 2 is a graph showing the relation of the position of the virtual source produced by the gun shown in FIG. 1 to the ratio $V_0/V_1$.
Figure 3A:
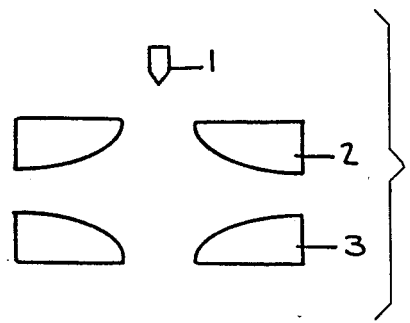
FIGS. 3(a)-3(d) are diagrams showing the shapes of the electrodes of conventional field emission electron guns.
Figure 3B:
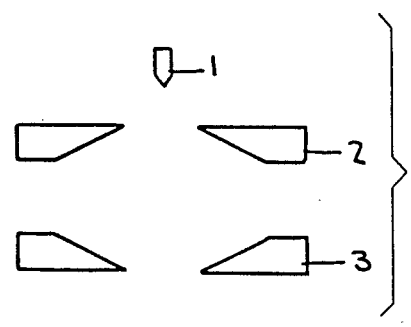
Figure 3C:
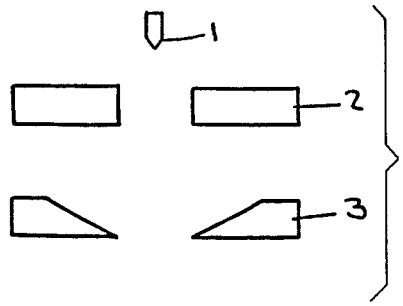
Figure 3D:
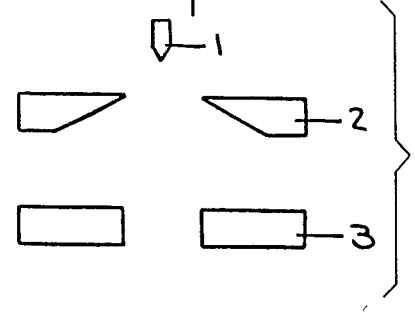
Figure 4:
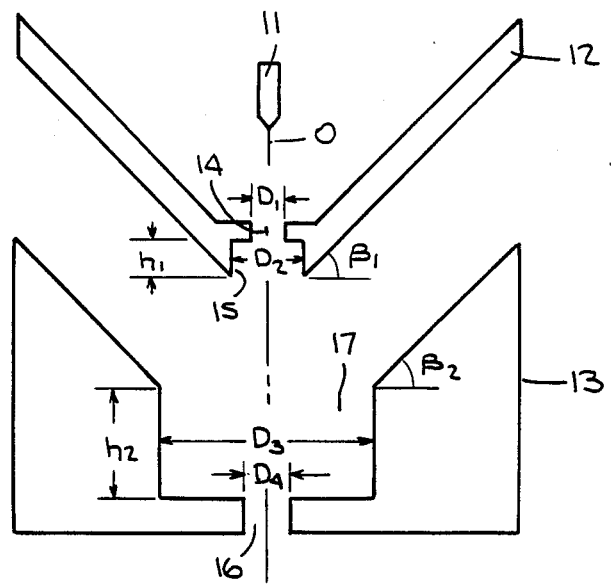
FIG. 4 is a diagram showing the geometry of a field emission electron gun according to the invention.

Referring to FIG. 4, there is shown a field emission electron gun according to the invention. This gun comprises a cathode 11, an extraction electrode 12, and an accelerating electrode 13. Usually, the accelerating electrode 13 is placed at ground potential. An accelerating voltage source (not shown) applies an accelerating voltage to the cathode 11. An extraction voltage source (not shown) applies an extraction voltage to the extraction electrode 12, which is shaped like an inverted cone. The outer surface of the electrode 12 is inclined at an angle of $\beta_1$ to a plane perpendicular to the optical axis 0. The electrode 12 is formed with a hole 15 having diameter $D_2$ and depth $h_1$ at its front end. An opening 14 of diameter $D_1$ is formed over the hole 15 to permit passage of the electron beam.

The surface of the accelerating electrode 13 which faces the extraction electrode 12 is shaped like an inverted cone in the same way as the extraction electrode. This surface is tilted at an angle to $\beta_2$ to a plane perpendicular to the optical axis 0. The accelerating electrode 13 is centrally provided with an opening 16 of diameter $D_4$ to permit passage of the electron beam. A hole 17 having diameter $D_3$ and height $h_2$ is formed in the center of the electrode 13 and opposite to the extraction electrode 12.

Figure 5:
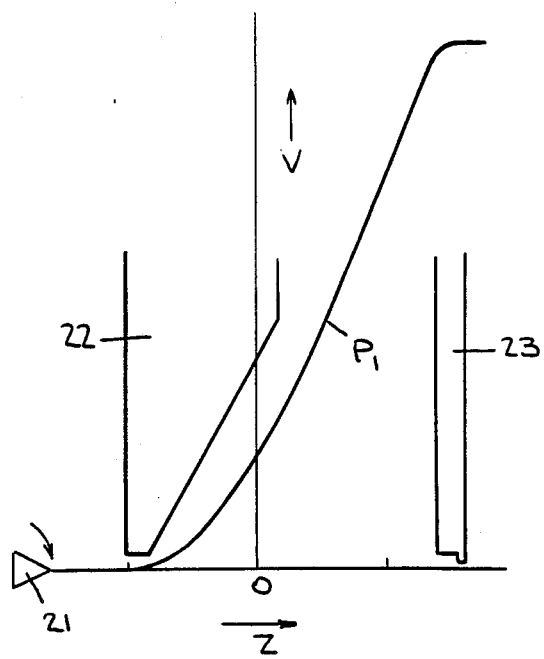
FIGS. 5-7 are diagrams showing the shapes of various existing electrodes and the distributions of the axial potentials created by the electrodes.
Figure 6:
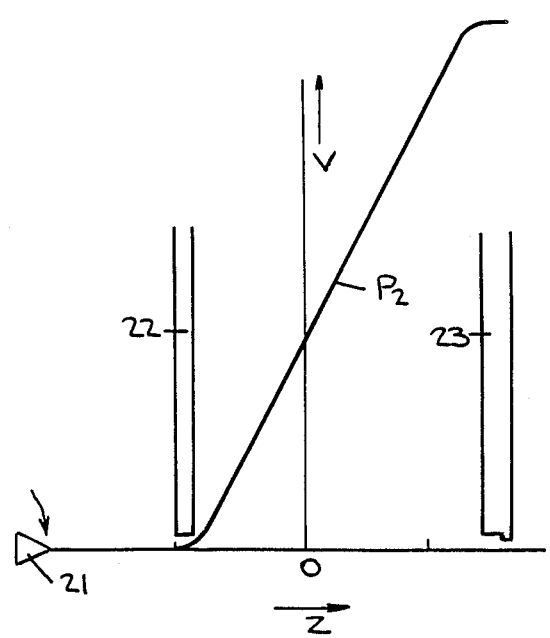
Figure 7:
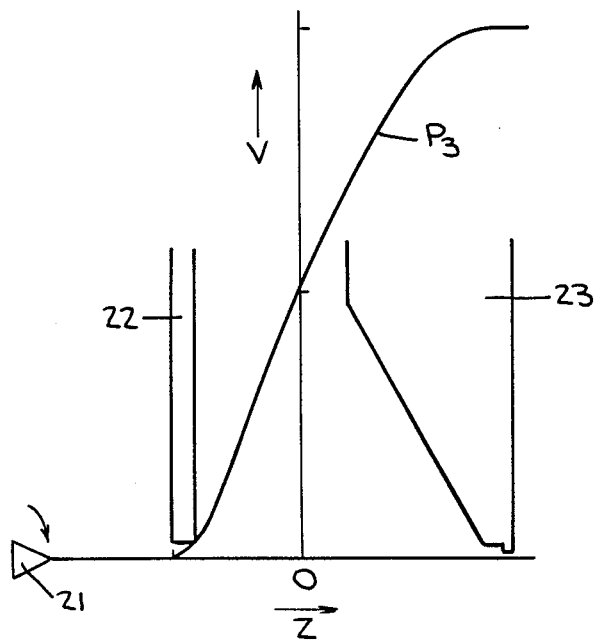

The reason for the field emission electron gun of the above-described structure is now described. FIGS. 5–7 show the shapes of various conventional electrodes, as well as the distributions of the axial potentials created by the electrode geometries. In FIGS. 5–7, a field emission tip 21, an extraction electrode 22, and an accelerating electrode 23 are shown. In FIG. 5, the accelerating electrode 23 takes the form of a flat plate, and the surface of the extraction electrode 22 which faces the accelerating electrode 23 is tilted. In FIG. 6, both extraction electrode 22 and accelerating electrode 23 assume the form of a flat plate. In FIG. 7, the extraction electrode 22 is shaped like a flat plate, and the surface of the cone-shaped accelerating electrode 23 that faces the extraction electrode 22 is inclined at an angle of 30° to a plane perpendicular to the optical axis O, in a relation reverse to the geometry shown in FIG. 5. The distributions $P_1$–$P_3$ of the axial potentials were calculated, based on the shapes of these electrodes by computer simulation.

Figure 8:
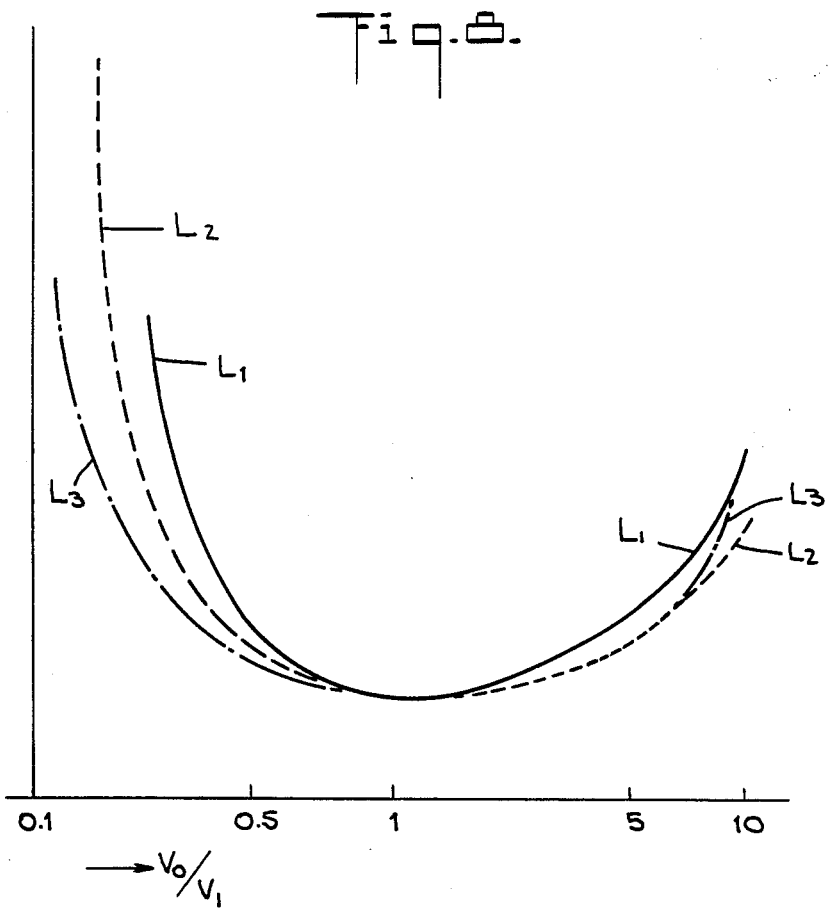
FIG. 8 is a graph in which the distances S to the virtual source produced by each electrode geometry shown in FIGS. 5-7 are plotted against the ratio $V_0/V_1$.

FIG. 8 shows the relation between the distance S to the virtual source produced by each electron gun having the electrode geometries shown in FIGS. 5–7 and the ratio $V_0/V_1$. This relation was found by computer simulation, based on the distributions of the axial potentials. In FIG. 8, solid line $L_1$ indicates the distance S to the virtual source produced in the virtual image region by the electrode geometry shown in FIG. 5. Dotted line $L_2$ indicates the distance S to the virtual source generated by the electrode geometry shown in FIG. 6. Dot-and-dash line $L_3$ indicates the distance S to the virtual source located in the virtual image region by the electrode geometry shown in FIG. 7. Comparing these three lines shows that electrode geometry of FIG. 7 indicated by the dot-and-dash line $L_3$ enables the lower limit of the ratio $V_0/V_1$ to be reduced most while maintaining the virtual source within the virtual image region. That is, in the electrode geometry in which the surface of the accelerating electrode 23 facing the extraction electrode 22 is tilted, the lower limit of the ratio $V_0/V_1$ can be made smaller as compared with the electrode geometry in which the accelerating electrode is perpendicular to the optical axis 0, provided that the virtual source 4 is maintained within the virtual image region.

Figure 9:
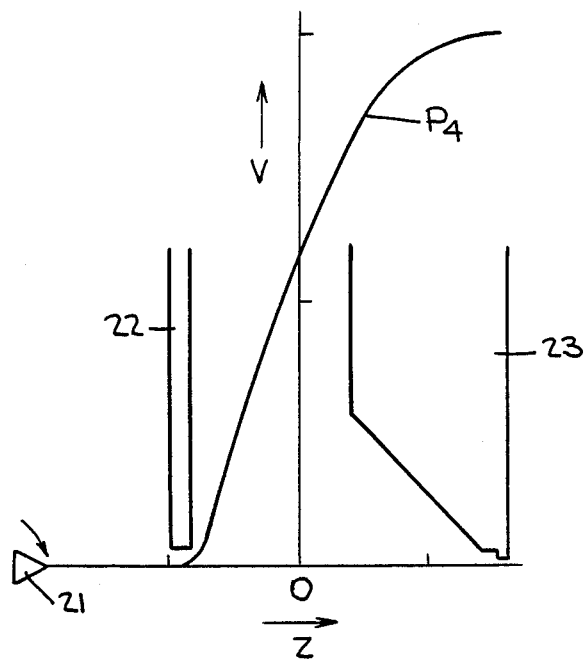
FIGS. 9-12 are diagrams showing the shapes of various electrodes designed in accordance with the present invention and the distributions of the axial potentials created by those electrodes.
Figure 10:
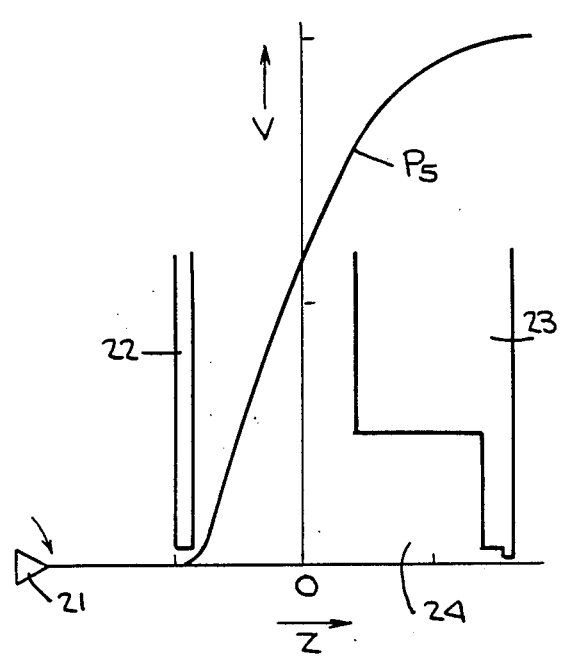
Figure 11:
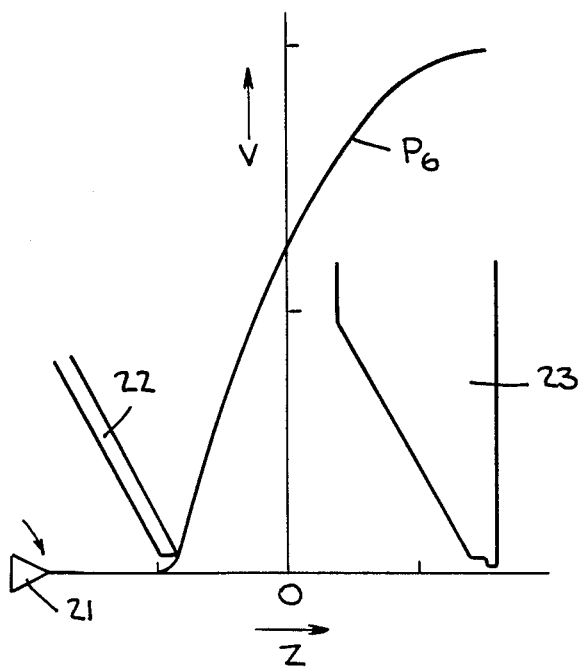
Figure 12:
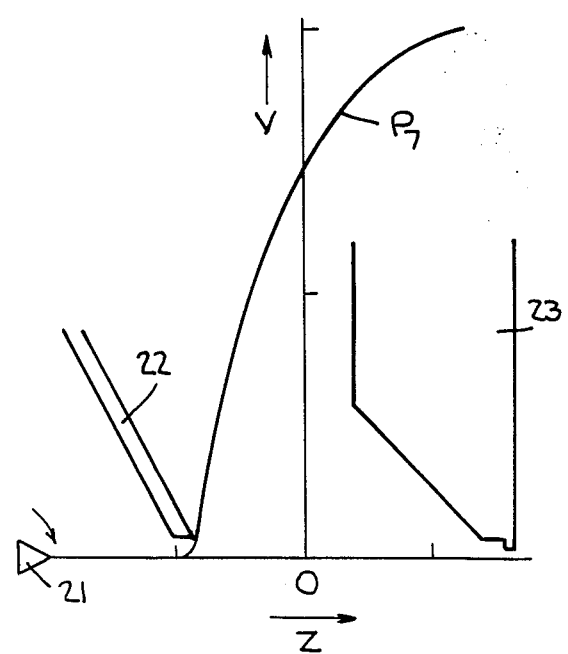

FIGS. 9–12 show the distributions of the axial potentials created by variously modified extraction electrodes 22 and accelerating electrodes 23. In FIG. 9, the extraction electrode 22 takes the form of a flat plate, and the surface of the cone-shaped accelerating electrode 23 facing the extraction electrode 22 is inclined to a plane perpendicular to the optical axis, similar to the geometry shown in FIG. 7. In this case, the angle of the inclination has a larger value of 45°. In FIG. 10, the extraction electrode 22 extends at right angles to the optical axis 0. A recess 24 is formed in the accelerating electrode 23 near the optical axis 0. In FIG. 11, the side of the cone-shaped extraction electrode 22 is inclined at an angle of 30° to a plane perpendicular to the optical axis 0. The surface of the accelerating electrode 23 facing the extraction electrode 22 is also inclined at an angle of approximately 30°. The electrode geometry shown in FIG. 12 is similar to the geometry shown in FIG. 11 except that the extraction electrode 22 and said surface of the accelerating electrode 23 are inclined at a larger angle of 45°. In FIGS. 9–12, $P_4$–$P_7$ show the distributions of the axial potentials calculated by computer simulation from the shapes of the electrodes.

Figure 13:
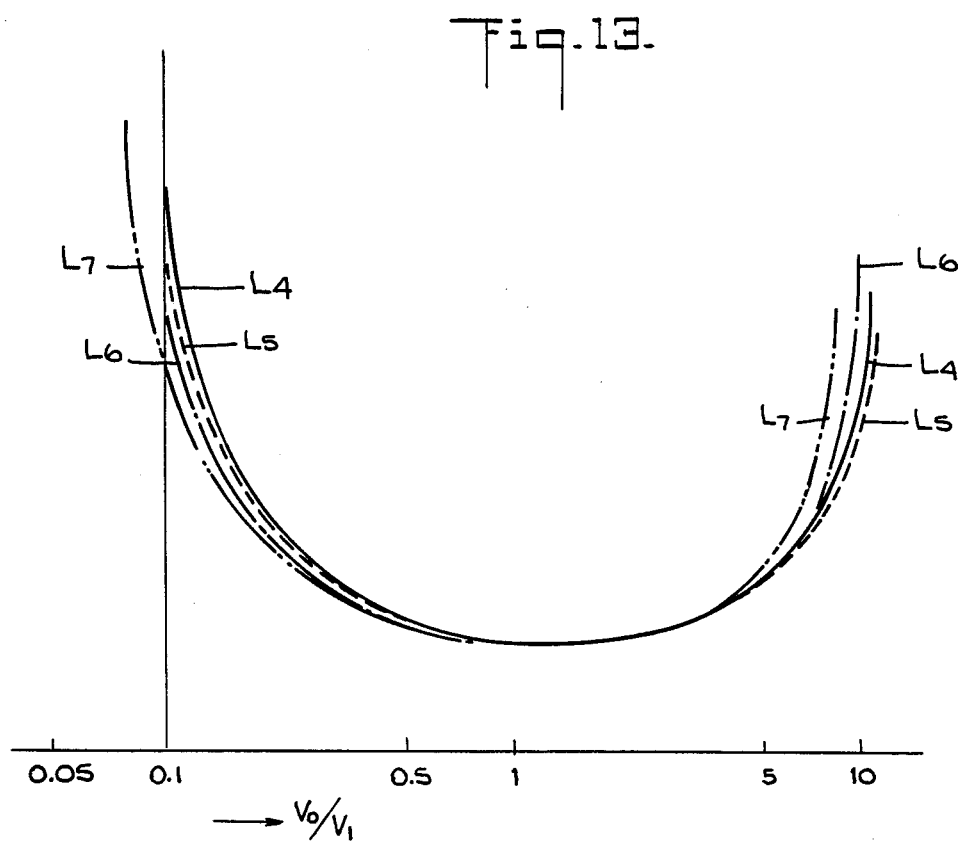
FIG. 13 is a graph in which the distances S to the virtual source produced by each electrode geometry shown in FIGS. 9-12 are plotted against the ratio $V_0/V_1$.

FIG. 13 shows the relation between the distance S to the virtual source and the ratio $V_0/V_1$ for the electron guns of the electrode geometries shown in FIGS. 9–12. In FIG. 13, solid line $L_4$ indicates the distance S to the virtual source produced by the electrode geometry shown in FIG. 9, the virtual source being located in the virtual image region. Dotted line $L_5$ indicates the distance S to the virtual source produced by the electrode geometry shown in FIG. 10. Dot-and-dash line $L_6$ indicates the distance S to the virtual source produced by the electrode geometry shown in FIG. 11. Phantom line $L_7$ indicates the distance S to the virtual source generated by the electrode geometry shown in FIG. 12, the source being located inside the virtual region. Comparing these four lines reveals that the lower limit of the ratio $V_0/V_1$ can be reduced most in the case of the electrode geometry of FIG. 12 indicated by the phantom line $L_7$, provided that the virtual source is located within the virtual image region. Also it can be seen that for the electrode structure of FIG. 10 indicated by the dotted line $L_5$, the virtual source can be kept within the virtual image region up to larger values of $V_0/V_1$. That is, the structure in which the extraction electrode 22 is inclined to the optical axis 0 can provide less values of $V_0/V_1$ than offered by the structure in which the extraction electrode extends perpendicular to the optical axis 0, provided that the virtual source is maintained within the virtual image region. The geometry in which the accelerating electrode 23 has the recess 24 can give greater values $V_0/V_1$, provided that the virtual source is kept within the virtual image region.

Figure 14:
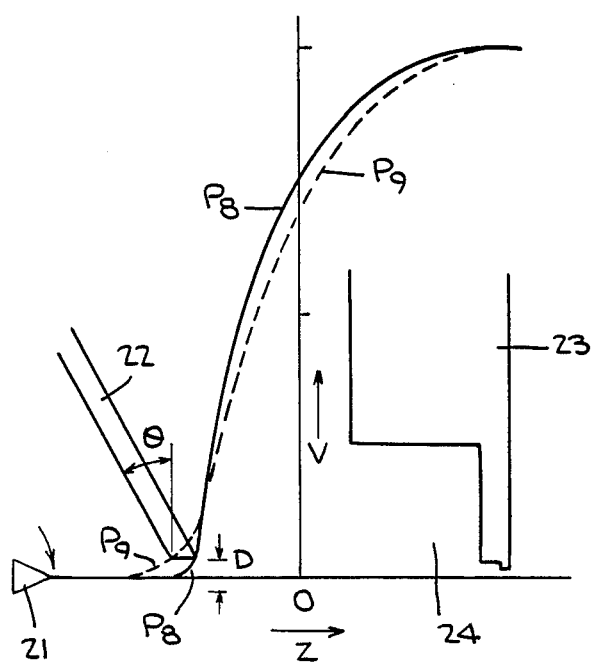
FIG. 14 is a diagram showing the shapes of other electrodes designed in accordance with the present invention and the distribution of the axial potential created by those electrodes.

The embodiment in FIG. 14 has an extraction 22 inclined to the optical axis 0 and an accelerating electrode 23 having a recess 24. The diameter D of the opening formed in the extraction electrode 22 to permit passage of the electron beam was changed. Then the distributions of the axial potentials $P_8$ and $P_9$ were calculated. The potential $P_a$ was obtained where the electrode 22 was inclined at an angle $\theta$ of 45° to the optical axis 0 and the diameter D of the opening in the extraction electrode 22 was 2 mm. The potential $P_9$ was derived in the case where the electrode 22 was inclined at an angle $\theta$ of 45° to the optical axis and the diameter D of the opening in the extraction electrode 22 was 6 mm. The relation between the distance S of the virtual source and the ratio $V_0/V_1$ is shown in FIG. 15 for these two potentials. In FIG. 15, solid line $L_8$ indicates the relation obtained where the diameter D of the opening permitting passage of the electron beam is 2 mm. Dotted line $L_9$ indicates the relation derived where the diameter D is 6 mm. As can be seen from this graph that increasing the diameter D of the opening in the extraction electrode 22 increases the upper limit of the ratio $V_0/V_1$, provided that the virtual source is retained within the virtual image region.

Figure 18:
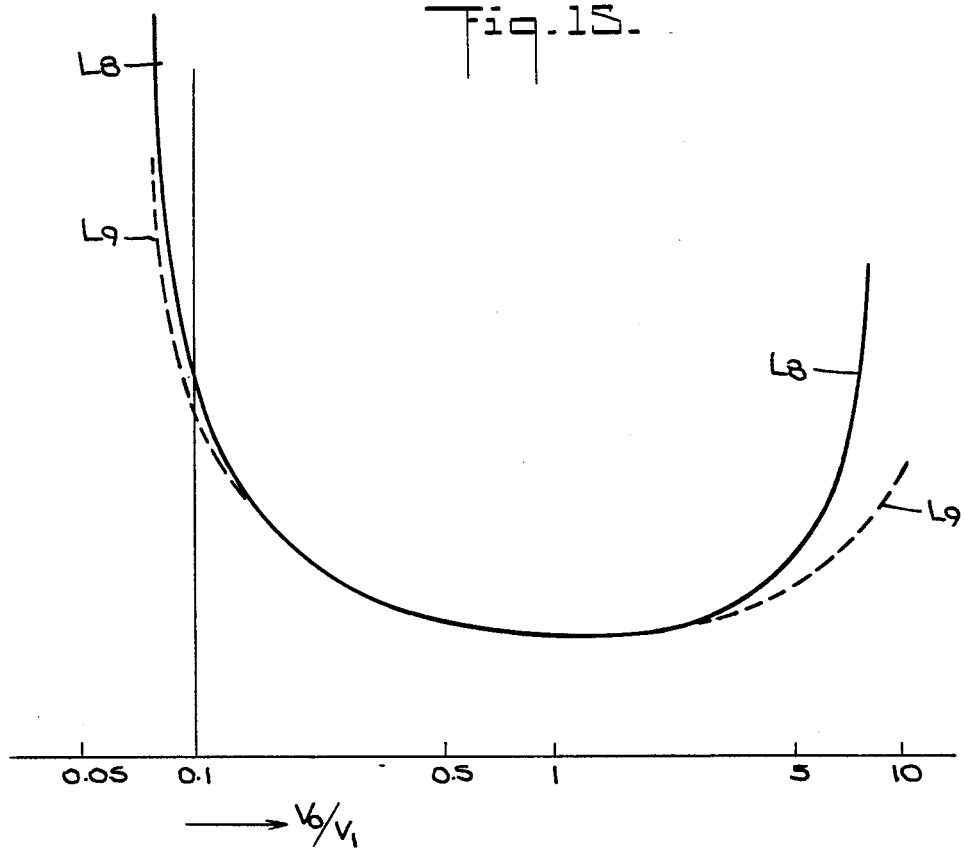
FIGS. 16-18 are diagrams showing the shapes of electrodes according to the invention and the distributions of the axial potential created by those electrodes.
Figure 19:
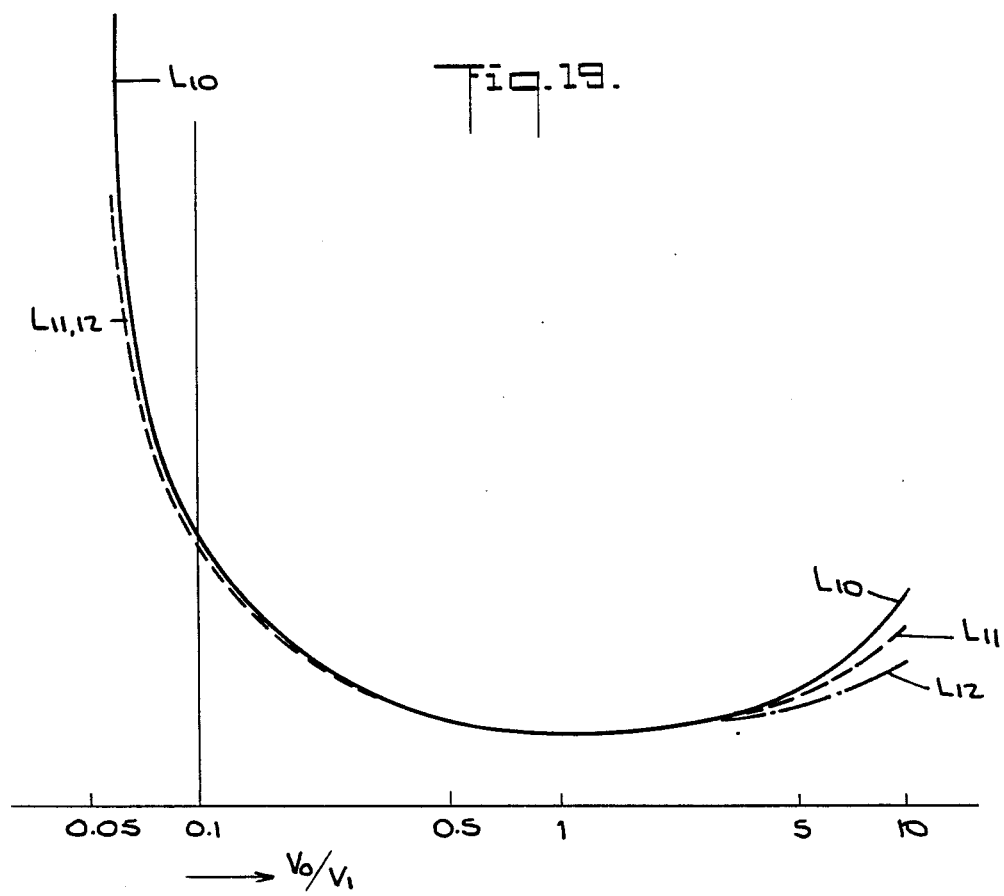
FIG. 19 is a graph in which the distances S to the virtual source produced by each electrode geometry shown in FIGS. 16–18 are plotted against the ratio $V_0/V_1$.
Figure 16:
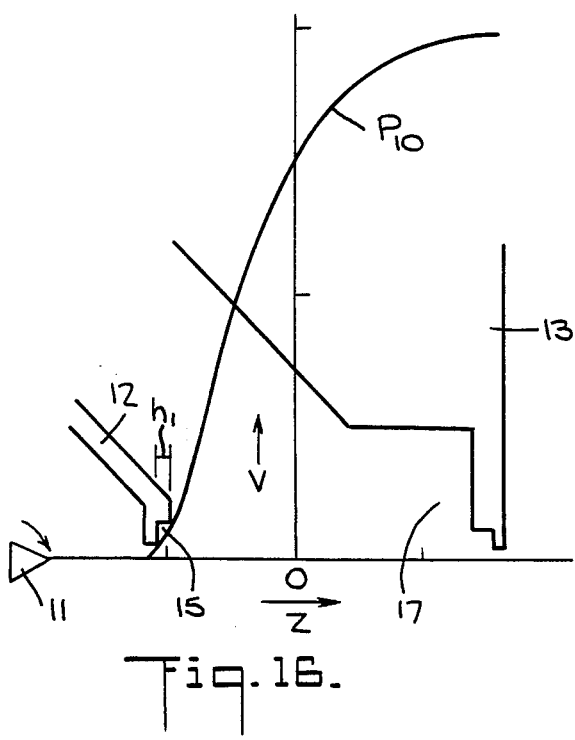
Figure 17:
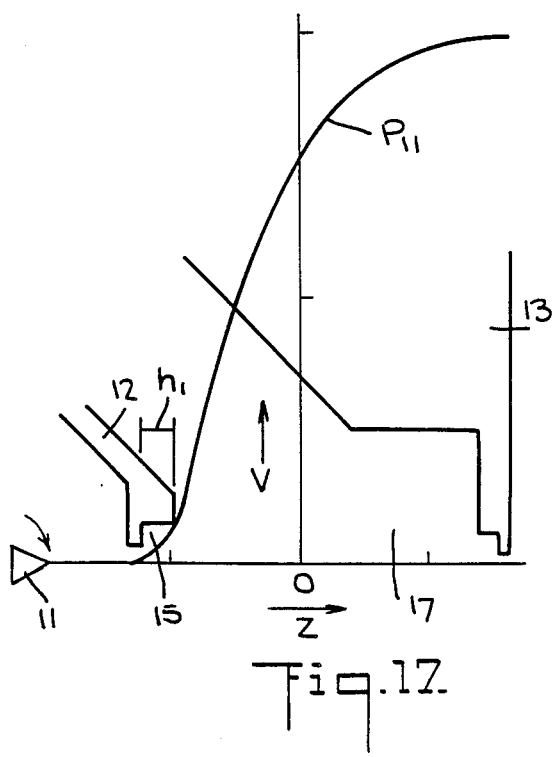
Figure 18:
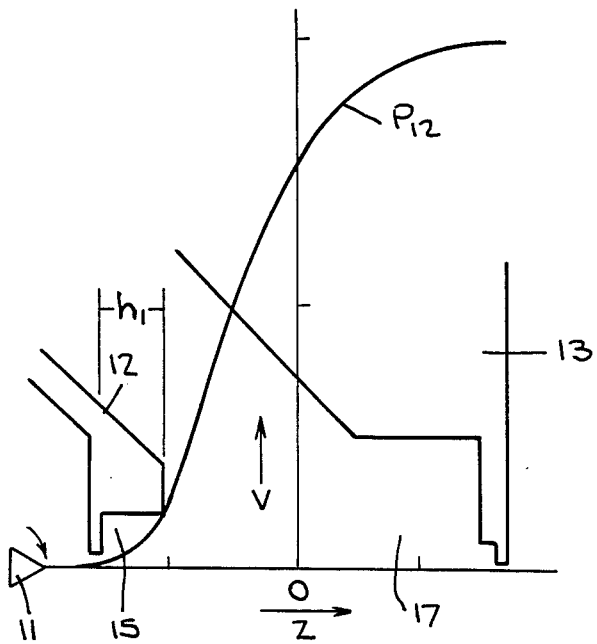

From the above studies we have come to the conclusion that the ratio $V_0/V_1$ can be changed over a wider range provided that the virtual source is kept within the virtual image region, in the case where the extraction electrode 22 is shaped into an inverted cone whose side is inclined to a plane perpendicular to the optical axis of the electron beam, the surface of the accelerating electrode 23 facing the extraction electrode 22 is inclined, and the accelerating electrode 23 has the recess 24. However, if the diameter of the opening in the extraction electrode 22 is increased, then the electric field set up by the accelerating electrode 23 reaches the tip 21 with undesirable results. For this reason, the opening in the extraction electrode 22 is made small to shield the tip 21 from the electric field generated by the accelerating electrode 23. Instead, a recess 25 is formed at the front end of the extraction electrode 22 and opposite to the accelerating electrode. This yields substantially the same advantage as in the case where the diameter is made larger. Based on these considerations, the electrode geometry shown in FIG. 4 has been developed. FIGS. 16–18 show the shapes of the electrodes shown in FIG. 4, as well as the distributions $P_{10}$–$P_{12}$ of the axial potentials produced by the electrode geometries. In FIG. 16, the recess 15 formed in the extraction electrode 12 has a depth $h_1$ of 1.5 mm. In FIG. 17, the depth $h_1$ is 3 mm. In FIG. 18, the depth $h_1$ is 5 mm. FIG. 19 shows the relation between the distance S to the virtual source and the ratio $V_0/V_1$ for the electrode geometries shown in FIGS. 16–18. In FIG. 19, solid line $L_{10}$ indicates the relation obtained from the electrode geometry shown in FIG. 16 Dotted line $L_{11}$ indicates the relation obtained from the electrode geometry shown in FIG. 17. Dot-and-dash $L_{12}$ indicates the relation derived from the electrode geometry shown in FIG. 18. In any case, the position of the virtual source in the virtual image region can change over a wider range in relation to the ratio $V_0/V_1$. The threshold value $\alpha_1$ is approximately 0.06. The threshold value $\alpha_2$ is in excess of 10. Under these conditions, where the extraction voltage $V_1$ is 4 to 8 KV, the accelerating voltage can be varied over a wide range of approximately 0.5 to 40 KV, provided that the virtual source is kept within the virtual image region. Therefore, even if the accelerating voltage is lower, the lens system located below the electron gun allows the electron beam to be continuously focused onto the specimen. Further, the lens system disposed below the gun can be controlled with greater ease.

The terms "field emission electron gun", "scanning electron microscope", "cathode", "extraction electrode", "accelerating electrode", "electrostatic lens", "optical axis", "virtual electron source", "virtual source", "virtual image region", "real image region", "field emission tip", "voltage source", and other terms identifying features of the disclosed invention are each used generically; that is, the functional requirements that must be met by each of the elements identified by these terms will be apparent to one of ordinary skill in the art, and those terms accordingly are used throughout the specification and the claims to designate any element which meets such requirements.

The present invention is not limited to the details of the foregoing embodiments but includes various modifications within the scope and spirit of the appended claims.

What is claimed is:

1. A field emission electron gun comprising:
a field emission tip;
an extraction electrode for producing an electron beam along an optical axis by extracting electrons from said tip, wherein said extraction electrode is shaped like an inverted cone the side of which is inclined at a first angle to a plane perpendicular to the optical axis of the electron beam; and
an accelerating electrode for accelerating the electrons extracted by said extraction electrode, wherein the side of said accelerating electrode is inclined at a second angle to a plane perpendicular to the optical axis of the electron beam.

2. A field emission electron gun according to claim 1 further comprising a first recess formed in the center of said accelerating electrode and facing said extraction electrode.

3. A field emission electron gun according to claim 2 further comprising a second recess formed at the front end of said extraction electrode and facing said accelerating electrode.

4. A field emission electron gun according to claim 1, wherein the first and second angles are each substantially 30 degrees.

5. A field emission electron gun according to claim 1, wherein the first and second angles are each greater than 30 degrees.

6. A field emission electron gun according to claim 1, wherein the first and second angles are each substantially 45 degrees.

7. A field emission electron gun according to claim 1, wherein the first and second angles are each greater than 45 degrees.

8. A field emission electron gun comprising:
a field emission tip;
an extraction electrode for producing an electron beam along an optical axis by extracting electrons from said tip, wherein said extraction electrode is perpendicular to the optical axis of the electron beam; and
an accelerating electrode, having a surface shaped like a cone for accelerating the electrons extracted by said extraction electrode, wherein the axis of said accelerating electrode, lies on the optical axis and the side of said accelerating electrode is inclined at an angle of at least 45° to a plane perpendicular to the optical axis of the electron beam.

9. A field emission electron gun according to claim 8 further comprising a first recess formed in the center of said accelerating electrode and facing said extraction electrode.

10. A field emission electron gun according to claim 9 further comprising a second recess formed at the front end of said extraction electrode and facing said accelerating electrode.

11. A field emission electron gun comprising:
a field emission tip;
an extraction electrode for producing an electron beam along an optical axis by extracting electrons from said tip, wherein said extraction electrode is shaped like an inverted cone is inclined at a first angle to a plane perpendicular to the optical axis of the electron beam;
an accelerating electrode for accelerating the electrons extracted by said extraction electrode, wherein the side of said accelerating electrode is inclined at a second angle to a plane perpendicular to the optical axis of the electron beam;
a first recess formed in the center of said accelerating electrode and facing said extraction electrode; and
a second recess formed at the front end of said extraction electrode and facing said accelerating electrode.

12. A field emission electron gun comprising:
a field emission tip;
an extraction means for producing an electron beam along an optical axis by extracting electrons from said tip, wherein said extraction means is shaped like an inverted cone the side of which is inclined at a first angle to a plane perpendicular to the optical axis of the electron beam; and
an accelerating means for accelerating the electrons extracted by said extraction means, wherein the side of said accelerating means is inclined at a second angle to a plane perpendicular to the optical axis of the electron beam.

13. A field emission electron gun according to claim 12 further comprising a first recess formed in the center said accelerating means and facing said extraction means.

14. A field emission electron gun according to claim 13 further comprising a second recess formed at the front end of said extraction means and facing said accelerating means.

* * * * *